(12) United States Patent
Chung et al.

(10) Patent No.: US 10,935,969 B2
(45) Date of Patent: Mar. 2, 2021

(54) VIRTUAL METROLOGY SYSTEM AND METHOD

(71) Applicant: United Microelectronics Corp., Hsinchu (TW)

(72) Inventors: Feng-Chi Chung, Miaoli County (TW); Ching-Hsing Hsieh, Hsinchu County (TW); Yi-Chun Lin, Tainan (TW); Chien-Chuan Yu, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 4 days.

(21) Appl. No.: 16/285,067

(22) Filed: Feb. 25, 2019

(65) Prior Publication Data

US 2019/0187674 A1   Jun. 20, 2019

Related U.S. Application Data

(62) Division of application No. 14/485,280, filed on Sep. 12, 2014, now Pat. No. 10,261,504.

(30) Foreign Application Priority Data

Aug. 5, 2014   (TW) .............................. 103126779 A

(51) Int. Cl.
*G05B 23/02* (2006.01)
*G03F 7/20* (2006.01)

(52) U.S. Cl.
CPC ...... *G05B 23/0221* (2013.01); *G03F 7/70608* (2013.01); *G03F 7/70616* (2013.01)

(58) Field of Classification Search
CPC .............. G03F 7/70608; G03F 7/0616; G05B 23/0221
See application file for complete search history.

(56) References Cited

U.S. PATENT DOCUMENTS

| | | |
|---|---|---|
| 6,850,811 B1 | 2/2005 | Stewart |
| 7,321,993 B1 | 1/2008 | Markle et al. |
| 7,493,185 B2 | 2/2009 | Cheng et al. |
| 7,593,912 B2 | 9/2009 | Cheng et al. |
| 7,603,328 B2 | 10/2009 | Cheng et al. |
| 7,657,339 B1 | 2/2010 | Retersdorf |
| 8,095,484 B2 | 1/2012 | Cheng et al. |
| 8,620,468 B2 | 12/2013 | Moyne |
| 9,842,186 B2 | 12/2017 | Chen et al. |
| 10,134,613 B2 | 11/2018 | Qiao et al. |
| 2004/0122859 A1 | 6/2004 | Gavra et al. |
| 2004/0267395 A1* | 12/2004 | Discenzo ............. G05B 13/024 700/99 |
| 2005/0288812 A1 | 12/2005 | Cheng et al. |
| 2006/0111804 A1 | 5/2006 | Lin |
| 2006/0184264 A1 | 8/2006 | Willis et al. |

(Continued)

*Primary Examiner* — Jennifer L Norton
(74) *Attorney, Agent, or Firm* — J.C. Patents

(57) ABSTRACT

A virtual metrology system at least includes a process apparatus including a set of process data, the process apparatus producing a workpiece according to the set of process data. A virtual metrology server is configured to gather the set of process data, cluster the set of process data to obtain data clusters, and compare the data clusters with patterns. If the data clusters meet the patterns corresponding to the data clusters, performing a corresponding maintenance, repair, and overhaul step on the process apparatus.

4 Claims, 6 Drawing Sheets

(56) References Cited

U.S. PATENT DOCUMENTS

| | | |
|---|---|---|
| 2007/0129839 A1* | 6/2007 | Tsubakida ........ G05B 19/41865 700/121 |
| 2007/0282767 A1 | 12/2007 | Cheng et al. |
| 2008/0010531 A1 | 1/2008 | Hendler et al. |
| 2009/0204234 A1* | 8/2009 | Sustaeta ............. G05B 13/0285 700/29 |
| 2010/0030521 A1* | 2/2010 | Akhrarov ............... G06N 20/00 702/182 |
| 2011/0190917 A1 | 8/2011 | Moyne |
| 2011/0251707 A1 | 10/2011 | Cheng et al. |
| 2011/0264404 A1* | 10/2011 | Yanai .................... G03F 7/7065 702/150 |
| 2012/0029662 A1 | 2/2012 | Cheng et al. |
| 2012/0072002 A1 | 3/2012 | Ino |
| 2012/0323531 A1* | 12/2012 | Pascu .................. G01M 13/028 702/184 |
| 2013/0159226 A1 | 6/2013 | Cheng et al. |
| 2013/0288403 A1 | 10/2013 | Chen et al. |
| 2014/0107828 A1 | 4/2014 | Zhu et al. |
| 2015/0276558 A1* | 10/2015 | Cheng ..................... G06F 17/11 702/179 |
| 2016/0261622 A1* | 9/2016 | Danielson .......... H04L 67/1095 |
| 2018/0052726 A1* | 2/2018 | Yoshida .................. G06F 11/07 |
| 2018/0144003 A1 | 5/2018 | Formoso et al. |
| 2018/0164781 A1 | 6/2018 | Kubo et al. |
| 2018/0224817 A1 | 8/2018 | Shih et al. |
| 2018/0285320 A1 | 10/2018 | Yang et al. |
| 2018/0293722 A1 | 10/2018 | Crocco et al. |
| 2018/0307740 A1 | 10/2018 | Zhou et al. |
| 2018/0322363 A1 | 11/2018 | Urmanov et al. |
| 2019/0064789 A1* | 2/2019 | Natsumeda .......... G05B 23/024 |

\* cited by examiner

VIRTUAL METROLOGY SYSTEM AND METHOD

CROSS-REFERENCE TO RELATED APPLICATION

This application is a divisional application of and claims the priority benefit of U.S. application Ser. No. 14/485,280, filed on Sep. 12, 2014, now allowed, which claims the priority benefit of Taiwan application serial no. 103126779, filed on Aug. 5, 2014. The entirety of each of the above-mentioned patent applications is hereby incorporated by reference herein and made a part of this specification.

FIELD OF THE INVENTION

The invention relates to a virtual metrology (VM) system and a VM method. More particularly, the invention relates to a VM system and a VM method configured to cluster data according to a plurality of predetermined patterns and perform a corresponding step if the obtained data meet expectations.

DESCRIPTION OF RELATED ART

In the manufacturing-related industries, such as semiconductor and display panel manufacturing industries, quality control of workpieces produced by process equipment is required for ensuring stability of the manufacturing performance of the equipment and improving production and yield. Virtual metrology (VM) is a method to conjecture quality of a process workpiece according to the process data of the process equipment if no physical metrology operation is performed or can be performed on the process workpiece. When the VM technology is applied, the physical conditions or properties of chambers in one type of equipment or in one equipment are unlikely the same; hence, to make sure the conjecture accuracy, the conjecture model need be established according to the physical conditions or properties of different chambers in the equipment. In order not to spent significant labor cost and other costs on individually establishing respective models for different chambers in each equipment, an automatic virtual metrology (AVM) server and a method therefor have been proposed.

According to the AVM technology, a VM value and a feedback correction value are applied to ensure promptness and accuracy, e.g., the AVM process may be performed in a dual-phase manner. In phase I, the conjecture step is carried out by calculating the first-stage VM value of a certain workpiece right after the process data collection of the workpiece is completed, so as to satisfy the requirement for promptness. The Phase-II algorithm starts to collect the metrology data of a randomly selected workpiece in a cassette (for re-training or modulation) and then recalculate the phase-II VM data of all workpieces in the cassette to which the randomly selected workpiece belongs, so as to satisfy the requirement for accuracy. The AVM technology is also applied to generate a global similarity index (GSI) and a reliance index (RI) of the phase-I VM value and the phase-II VM value to quantify the reliability of the conjectured VM value. The AVM method saves tremendous time for introducing the VM algorithm to the chambers in the same type of equipment or in the same equipment as well as maintaining accuracy of real-time VM.

Please refer to FIG. 1 which is a schematic diagram illustrating a conventional AVM technical scheme. Each of the AVM system components is connected to the corresponding manufacturing equipment and metrology equipment; for instance, the AVM server 116 shown in FIG. 1 is connected to the corresponding manufacturing equipment 112 and metrology equipment 114. The other AVM server 126 is connected to the corresponding manufacturing equipment 122 and metrology equipment 124 The obtained data are transmitted to a model creation server 130, a VM management server 140, and a database 150 though a simple-object-access-protocol (SOAP) transmission interface, and the model creation server 130, the VM management server 140, and the database 150 transmit data to and share data with remote monitoring systems 160 and 162 through the SOAP transmission interface as well.

However, the existing VM schemes generally adopt the data driven methodology in different ways to ensure the correctness of the conjectured VM value. Such VM schemes often encounter the same problem, i.e., only issues arising from actual measurement can be recognized, and the correctness of data need be ensured by making corrections through feedback paths. In case of any unrecognizable issue, the feedback paths may worsen the problems, and thus real-time correction becomes impossible. Although a significant amount of the process data of manufacturing equipment may be collected, such data collection may merely serve to monitor the quality of the produced workpieces.

SUMMARY OF THE INVENTION

The invention is directed to a virtual metrology (VM) system and a VM method. In the VM system, the obtained data of tool conditions are clustered according to a plurality of predetermined patterns. The obtained data are calculated according to the patterns, so as to obtain a result. If the result meets expectations, a corresponding step is performed.

According to an embodiment of the invention, the corresponding step is a normal sampling step if the result indicates the obtained data meet one of the predetermined patterns. If the obtained data do not meet any of the predetermined patterns, an alarm is generated thereby, and the corresponding equipment may be shut down or other measures may be taken.

According to an embodiment of the invention, the corresponding step is a maintenance, repair, and overhaul step if the result indicates the obtained data meet one of the predetermined patterns.

According to an embodiment of the invention, if the obtained data of tool conditions do not meet any of the predetermined patterns, the data are stored; after certain amount of the data is accumulated, a new pattern is established, and the newly established pattern may dynamically serve as a basis for clustering data.

Several exemplary embodiments accompanied with figures are described in detail below to further describe the invention in details.

DETAILED DESCRIPTION OF DISCLOSED EMBODIMENTS

The invention is directed to a virtual metrology (VM) system and a VM method. In the VM system, the obtained data of tool conditions are clustered according to a plurality of predetermined patterns. The obtained data are calculated according to the patterns, so as to obtain a result. If the result meets expectations, a corresponding step is performed.

According to an embodiment of the invention, the corresponding step is a normal sampling step; that is, if the result indicates the obtained data meet one of the predetermined patterns, metrology is performed through carrying out the normal sampling step. For instance, the actual metrology data of a randomly selected workpiece are obtained as the basis for re-training or modulation, so as to satisfy the requirement for accuracy. If the obtained data do not meet any of the predetermined patterns, an alarm is generated thereby, and the corresponding equipment may be shut down or other measures may be taken. In an embodiment of the invention, if the obtained data do not meet any of the predetermined patterns, the data are stored and accumulated to a certain amount, and a new pattern for comparison is dynamically added.

In another embodiment of the invention, the corresponding step may be a maintenance step or a parts-replacing step. For instance, if the result meets one of the predetermined patterns, the maintenance step or the parts-replacing step is performed. If the result does not meet any of the predetermined patterns, the result is disregarded. However, if the manufacturing equipment is crashed because the maintenance step is not performed, the corresponding equipment parameters or data are stored and accumulated to a certain amount, and then a new pattern for comparison is dynamically added. A process apparatus is production equipment having a mechanical structure and various parts. The mechanical structure requires maintenance because of the accumulation of bi-products during production, and aging consumable parts require periodic replacement. The patterns can be associated with the accumulation state of bi-products during production or the aging state of the consumable parts.

According to the drawings, a VM system and a method therefor are provided below according to an embodiment of the invention, while the descriptions should not be construed as limitations to the invention.

Figure 1:
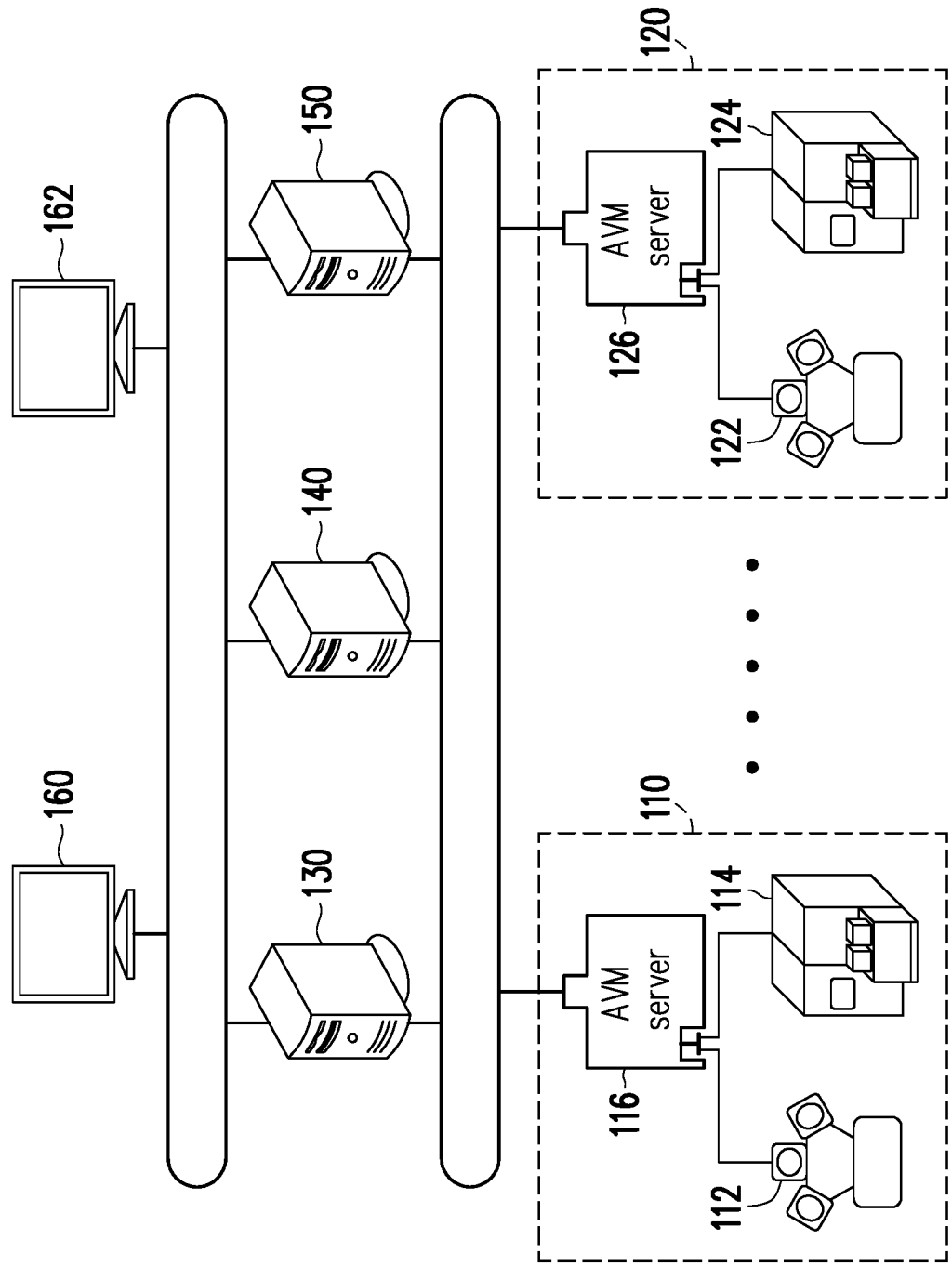
FIG. 1 is a schematic diagram illustrating a conventional automatic virtual metrology (AVM) technical scheme.
Figure 2:
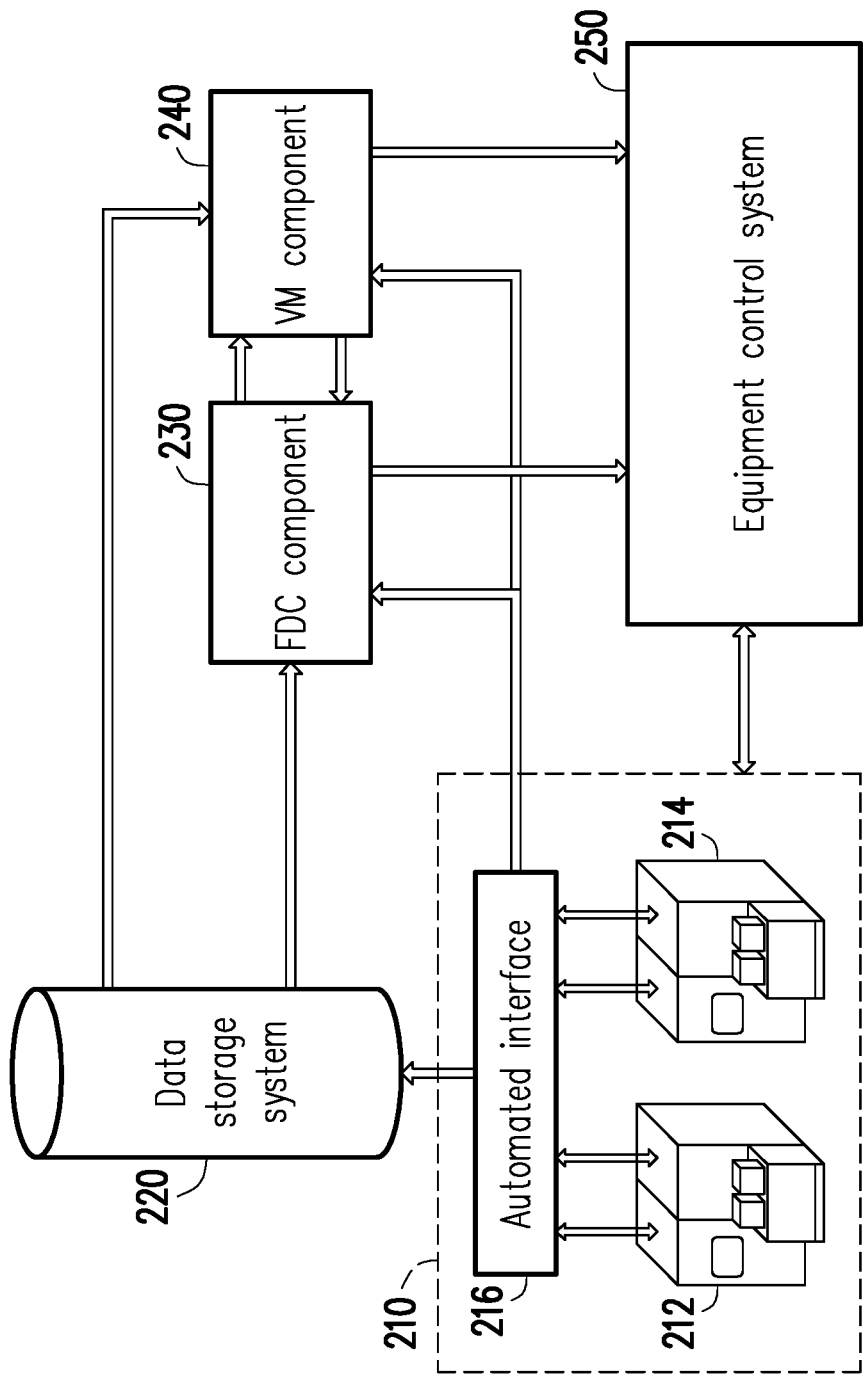
FIG. 2 is a schematic diagram illustrating manufacturing environment where a virtual metrology (VM) system is applied according to an embodiment of the invention.

FIG. 2 is a schematic diagram illustrating manufacturing environment where a virtual metrology (VM) system is applied according to an embodiment of the invention. The manufacturing environment may include an environment for manufacturing semiconductors, automobiles, liquid crystal display (LCD) panels, and so on. In the present embodiment, the manufacturing environment includes an on-site manufacturing system 210, an equipment control system 250, and a data storage system 220. The on-site manufacturing system 210, the equipment control system 250, and the data storage system 220 may be connected by communication networks for data exchange, e.g., through public Internet, internal private network (Ethernet or local area network), or a combination thereof.

The on-site system 210 is configured to performing processes for manufacturing various workpieces, and the manufacturing processes may be online/offline manual/automated manufacturing processes. Here, the on-site system 210 may include at least one manufacturing equipment 212, metrology equipment 214, other computer hosts, and other equipment that may be applied to complete the manufacturing processes. Through an automated interface 216, the on-site system 210 may communicate with and exchange data with the equipment control system 250 and the data storage system 220.

The manufacturing equipment 212 is, for instance, an ion implanter, a thermal reactor, an etcher, a lithography machine, and similar devices used in the semiconductor manufacturing process. The metrology equipment 214 may include ellipsometer, interferometer, scanning electron microscopy (SEM), or the like.

The automated interface 216 is connected to the manufacturing equipment 212, the metrology equipment 214, and other computer hosts, so as to obtain the process data. According to an embodiment of the invention, the automated interface 216, the manufacturing equipment 212, and the metrology equipment 214 may be connected through a connection interface for data exchange. Here, the connection interface includes a semiconductor equipment communication standards (SECS) interface, a generic model for communication and control of manufacturing equipment (GEM) interface, a SECS/GEM interface, and an equipment data acquisition (EDA) interface (i.e., interface A).

The on-site manufacturing system 210, the equipment control system 250, and the data storage system 220 communicate with each other and exchange data. The data storage system 220 may include a database, a file system, or any other data stored in a non-volatile memory or a volatile memory; here, the non-volatile memory is a hard disc, a cassette player, an optical storage medium, etc; the volatile memory may be a random access memory, for instance. In an embodiment of the invention, the data storage system 220 can obtain data from a plurality of data storage sources, e.g., from an equipment maintenance data source, a metrology data source, a process data source, and so on.

The data storage system 220 can store process data (e.g., manufacturing recipes), such as temperature, pressure, the used chemical materials, manufacturing time, etc. In addition, the data storage system 220 stores historical maintenance data of the manufacturing equipment, data of stocks, and so forth. The data storage system 220 also stores the process data obtained from the manufacturing equipment 212 of the on-site manufacturing system 210 or the metrology data obtained from the metrology equipment 214.

The process data may be process characterized parameters (e.g., different physical conditions or properties) executed by the manufacturing equipment, and these parameters may be obtained by sensors of the equipment and/or by operation parameters of the equipment and are collectively referred to as the process data. Among the process data, the data obtained by the sensors of the equipment exemplarily include pressure of a chamber, temperature, RF power, or RF reflection power, for instance. By contrast, among the process data, the operation parameters of the equipment are predetermined flow rates (of chemical reaction solvent, for instance), throttle valve settings (e.g., chemical chamber exhaust vacuum pump settings), and so forth.

The metrology data may include a wafer thickness metrology value (e.g., measured by an ellipsometer), a particle quantity metrology value (e.g., measured by scanning electron microscopy, SEM), a wafer curvature metrology value (e.g., measured by an interferometer), and so forth, for instance.

The equipment control system 250 may manage all or parts of operations in the manufacturing factory; besides, the equipment control system 250 may include online/offline manual/automated processes, and the control computations and operations are done by calculators or host servers. The processes, for instance, include a tracking and monitoring process performed on equipment, a delivery process of materials, a labor scheduling and adjusting process, etc. The equipment control system 250 may include a fault detection and classification (FDC) component 230 and a VM component 240.

The FDC component 230 may timely obtain data from the automated interface 216 of the on-site manufacturing system 210 and obtain data from the data storage system 220. The VM component 240 timely obtains the tools conditions of the manufacturing equipment or other data required by the VM method described herein through the automated interface 216 and obtain data from the data storage system 220. The FDC component 230 is connected to the VM component 240, and VM models of the VM component 240 may be employed to conjecture or measure data according to other metrology values or process data.

In the VM system and the VM method provided herein, the obtained data of tool conditions are clustered according to a plurality of predetermined patterns. The obtained data are calculated according to the patterns, so as to obtain a result. If the result meets expectations, a corresponding step is performed.

Figure 3:
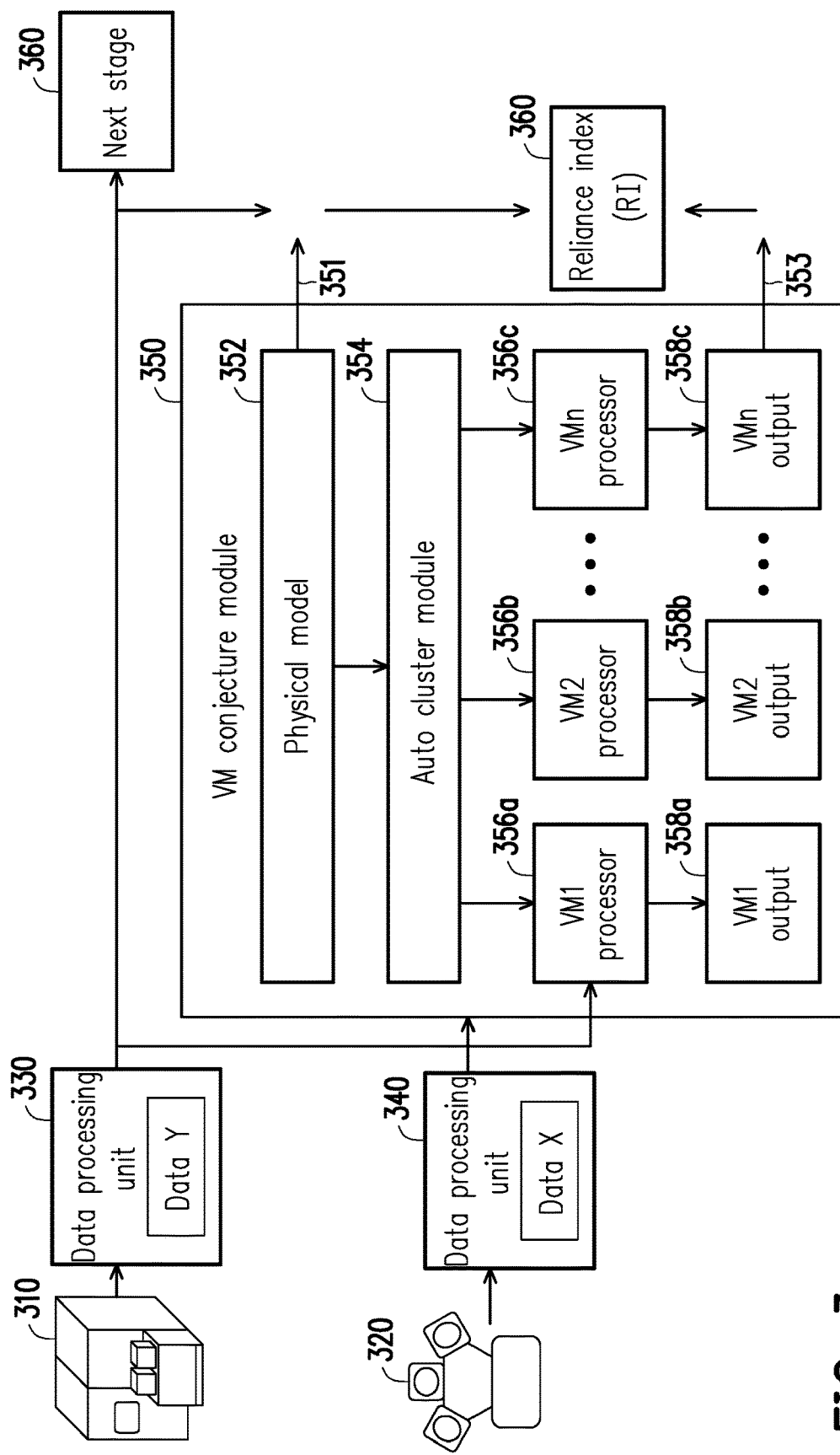
FIG. 3 is a schematic diagram illustrating a VM system and a VM method according to an embodiment of the invention.

FIG. 3 is a schematic diagram illustrating a VM system and a VM method according to an embodiment of the invention. In the present embodiment, the VM system at least includes a process apparatus, metrology equipment, and a VM server. As shown in FIG. 3, the VM system provided in the present embodiment includes metrology equipment 310, a process apparatus 320, a data processing unit 330, a data processing unit 340, and a VM conjecture module 350.

In an embodiment of the invention, the manufacturing environment is provided in the present embodiment with reference to FIG. 2, and the metrology equipment 310 or the process apparatus 320 can obtain the required process data or metrology data required by the manufacturing equipment of the on-site manufacturing system or required by the metrology equipment.

The data processing unit 330 is connected to the metrology equipment 310 to obtain the metrology data, the process data including manufacturing recipes stored in the data storage system depicted in FIG. 2, the historical data maintained by the manufacturing equipment, or the accumulated historical process data or metrology data obtained from the manufacturing equipment or the metrology equipment. Besides, the data processing unit 330 serves to provide the VM conjecture module 350 with calculation results (Y values) corresponding to the predetermined patterns. The Y values may be mean coefficients corresponding to the process data including a significant amount of manufacturing recipes, so as to obtain a conjectured value VP according to a computation formula while the corresponding process data are obtained. The conjectured value VP is compared with the Y value to determine whether the predetermined patterns are met, which will be exemplified in the following embodiment with reference to the drawings. Besides, the data processing unit 340 is connected to the process apparatus 320, so as to obtain the process data Xi to Xn of the process apparatus 320.

The conjecture module 350 is a software module or a firmware module the may be executed by parts of the equipment of the equipment control system 250; hence, no relevant descriptions are provided hereinafter, and the invention should not be limited thereto. Besides, the conjecture module 350 serves to gather the process data and cluster the process data to obtain a plurality of data clusters. The data clusters are compared with a plurality of patterns and are calculated according to the patterns to obtain a result. If the result meets expectations, a corresponding step is performed.

In an embodiment of the invention, the conjecture module 350 of the VM system includes an auto cluster module 354 and a plurality of VM processors; in the present embodiment, the VM system includes N VM processors, and only VM processors 356a, 356b, and 356c are provided herein for illustrative purposes. The conjecture module 350 obtains the process data Xi to Xn (e.g., the data obtained from the FDC component) of the equipment, and the obtained data are automatically clustered by an automatic clustering module 354, e.g., by selecting all or parts of the process data Xi to Xn required by each corresponding pattern.

The automatic clustering module 354 sends different data collections to the corresponding N VM processors; for instance, the data Xa (e.g., process data X1, X3, X5, and X7), the data Xb (e.g., process data X2, X4, X6, and X8), and the data Xc (e.g., process data X1, X5, X6, and X8) of the corresponding VM processors 356a, 356b, and 356c are sent to obtain different VM outputs 358a, 358b, and 358c. The data may be transformed to the output model 353 generated by the conjecture module 350.

The conjecture module 350 may selectively include a physical model 352 for making conjectures according to the obtained process data and generating an output model 351 based on the conjectures. The output model 353 generated by the conjecture module 350 and/or the output model 351 selectively generated by the conjecture module 350 may serve to generate the reliance index (RI) of the VM value, so as to quantify the reliability of the conjectured VM value or send the data to the next-stage equipment 360 for other purposes.

Figure 4A:
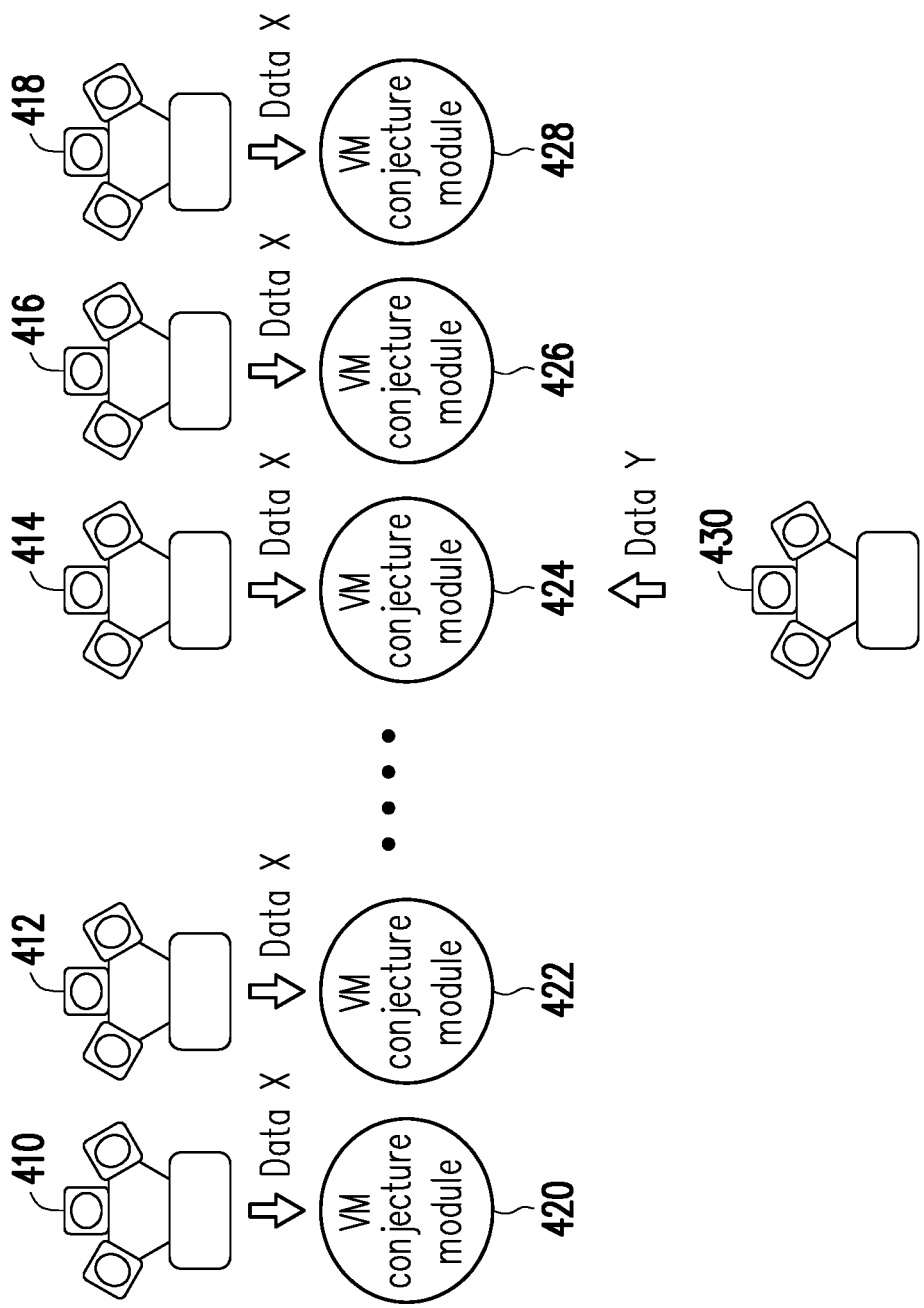
FIG. 4A is a schematic diagram illustrating a VM system according to another embodiment of the invention.
Figure 4B:
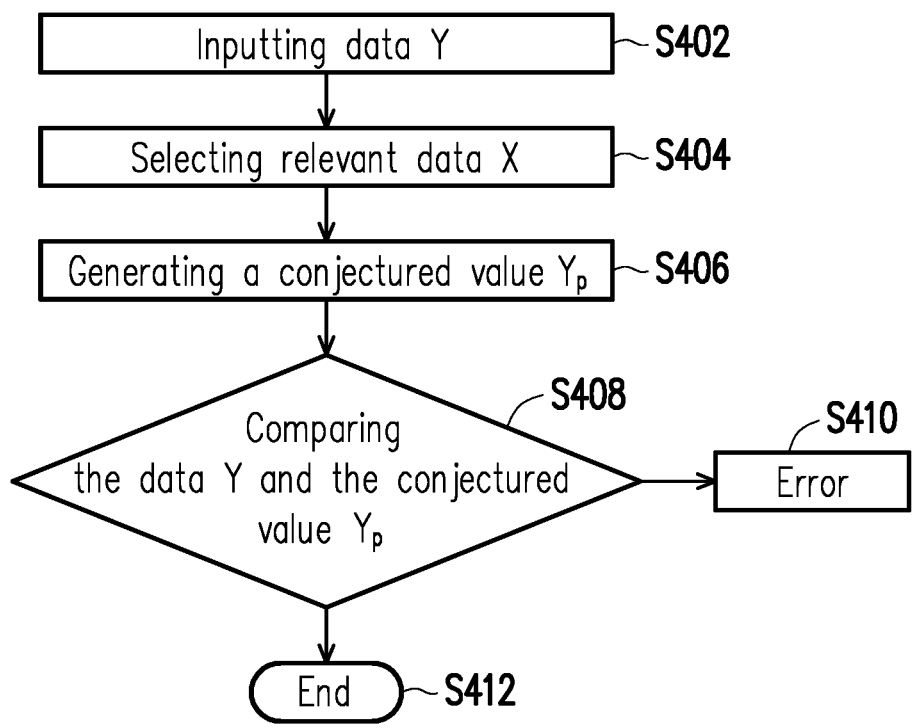
FIG. 4B is a schematic diagram illustrating relevant processes.

FIG. 4A is a schematic diagram illustrating a VM system according to another embodiment of the invention; FIG. 4B is a schematic diagram illustrating relevant processes. As shown in FIG. 4A, the VM system provided in the present embodiment includes a plurality of VM conjecture modules 420 to 428, and the data (i.e., the data X) relevant to the manufacturing process are transmitted from the process apparatuses 410 to 418 to the corresponding VM conjecture modules 420 to 428. Besides, the VM conjecture modules 420 to 428 receive relevant data (i.e., the data Y) from the process apparatus 430, so as to generate a corresponding comparison result.

With reference to FIG. 4B, steps in a VM method applicable to the VM system shown in FIG. 4A are illustrated. In step S402, the relevant data Y are input. In step S404, data X relevant to the predetermined patterns are selected from the obtained process data (i.e., the data X). In step S406, the conjectured data Yp are generated according to the obtained data Y and the relevant data X. In step S408, the data Y and the generated conjectured value Yp are compared, if the comparison result meets the corresponding pattern, no further step is performed. However, if the comparison result does not meet the corresponding pattern, an error message is displayed in step S410. According to an embodiment of the invention, if the comparison result meets the corresponding pattern, a normal sampling step is performed for measurement. If the comparison result does not meet any of the predetermined patterns, an alarm is generated thereby, and the corresponding equipment may be shut down or other measures may be taken.

Figure 5:
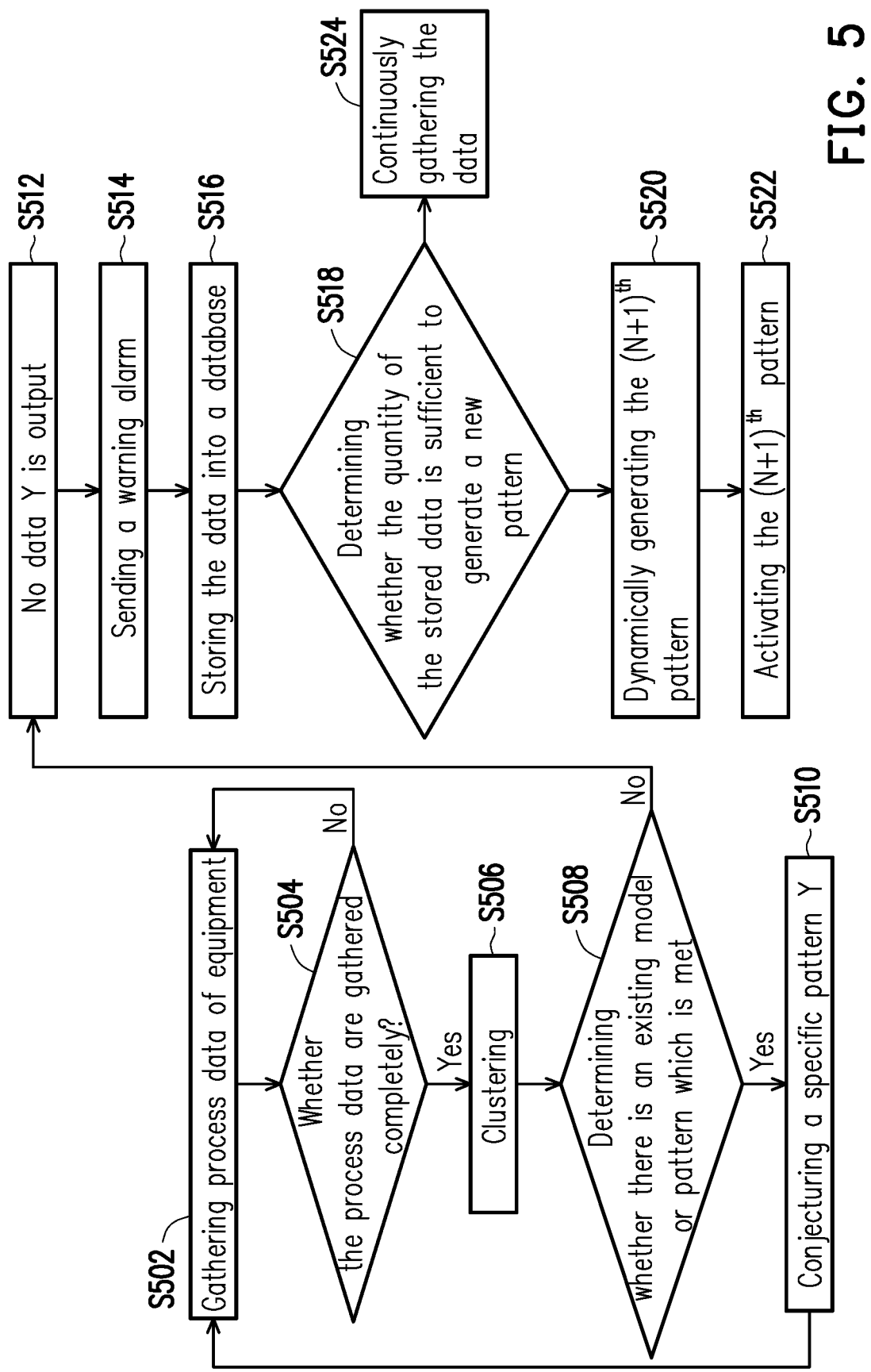
FIG. 5 is a schematic flowchart illustrating a VM method according to an embodiment of the invention.

FIG. 5 is a schematic flowchart illustrating a VM method according to an embodiment of the invention. In step S502, the process data of the equipment are gathered, e.g., the process data Xi to Xn are gathered, and n is an integer. In step S504, it is determined whether the process data Xi to Xn are gathered completely; if not, the step S502 is repeated. If the process data Xi to Xn are gathered completely, the process data Xi to Xn are clustered in step S506. The process data Xi to Xn may be process characterized parameters (e.g., different physical conditions or properties) executed by the manufacturing equipment, and these parameters may be obtained by either sensors of the equipment or by operation parameters of the equipment or both, and are collectively referred to as the process data. The data obtained by the sensors of the equipment exemplarily include pressure, temperature, RF power, or RF reflection power of the chamber, for instance. Among the process data, the operation parameters of the equipment are predetermined flow rates (of chemical reaction solvent, for instance), throttle valve settings (e.g., chemical chamber exhaust vacuum pump settings), and so forth.

After the process data Xi to Xn are completely clustered, in step S508, it is determined whether there is an existing model or pattern which is met; if yes, the conjectured value VP corresponding to a certain pattern is obtained by calculation. If there is no corresponding pattern, step S512 is performed to make sure no conjectured value corresponding to the data Y is output; in step S514, a corresponding step (e.g., issuing a warning alarm or temporarily stopping the equipment) is performed, and the manufactured and produced workpiece is physically measured. The obtained data and the measured result are respectively stored into individual sources; for instance, the data storage system depicted in FIG. 2 stores the process data (e.g., manufacturing recipes), such as temperature, pressure, the used chemical materials, manufacturing time, etc. Alternatively, the data storage system stores historical maintenance data of the manufacturing equipment, the measured data, and so forth. In step S518, it is determined whether the quantity of the stored data collections is sufficient to generate a new pattern. If the quantity of the stored data collections is insufficient, relevant data are continuously gathered in step S524. If the quantity of the stored data collections is sufficient, a new pattern is generated in step S520. For instance, if the number of patterns is N, the newly added pattern can be the $(N+1)^{th}$ pattern. In step S522, the (N+1) patterns are activated, so as to compare the patterns with the gathered data. In the VM system provided herein, patterns can be dynamically added in the aforesaid manner. After certain data collections not corresponding to the predetermined patterns are accumulated, new patterns can be dynamically added, so as to ensure the accuracy of the VM system.

The predetermined patterns are obtained by performing multiple inductions on a plurality of manufacturing recipes (including the process data obtained from the same or similar past manufacturing processes) and corresponding metrology data to find a plurality of models. For instance, in exemplary groups A, B, C, and D, different process data have different mean coefficients, and the input data Y are obtained by defining the significantly accumulated historical data as follows:

$$Y=A1X1+A2X3+A3X5+A4X6+A5X7+A6X8+A0$$

Here, the conjectured value Yp may be obtained by calculating the process data X1, X3, X5, X6, X7, and X8, and the corresponding mean coefficients are A1, A2, A3, A4, A5, A6, and A0, which represents a pattern.

The significantly accumulated historical data may be the obtained metrology data. For instance, the metrology data may include a wafer thickness metrology value (e.g., measured by an ellipsometer), a particle quantity metrology value (e.g., measured by scanning electron microscopy, SEM), a wafer curvature metrology value (e.g., measured by an interferometer), and so forth. The significantly accumulated process data and the correspondingly obtained metrology data may be applied to establish different models and thus generate different patterns.

As to the auto-classification technology, a chemical vapor deposition (CVD) process is performed for oxide thickness prediction in an embodiment of the invention, which will be explained hereinafter.

The process data Wj=(X1, X2, X3, . . . , X10) are obtained, wherein Wj is the $j^{th}$ wafer sample, Xi is the FDC parameter corresponding to the $j^{th}$ wafer sample, and in total there are N wafers. In the VM system and the VM method provided in an embodiment of the invention, the process data (e.g., Wj=(X1, X2, X3, . . . , X10)) of equipment are obtained. Here, Wj is the $j^{th}$ wafer sample, Xi is the FDC parameter corresponding to the $j^{th}$ wafer sample, and in total there are N wafers, whereby the data collections and the predetermined patterns are clustered. The patterns specifically meeting the manufacturing process or the equipment are obtained by performing inductions on the accumulated historical data; for instance, four data clusters with the mean coefficients Ai, Bi, Ci, and Di are adopted.

Group A:

$$Y=A1X1+A2X3+A3X5+A4X6+A5X7+A6X8+A0;$$

Group B:

$$Y=B1X2+B2X3+B3X4+B4X5+B5X6+B6X7+B7X8+B8X9+B0;$$

Group C:

$$Y=C1X1+C2X3+C3X5+C4X6+B5X7+C0;$$

Group D:

$$Y=D1X1+B2X2+B3X4+B4X7+B5X8+B6X9+B7X10+B0$$

Through said equations, the corresponding conjectured value Yp can be obtained. If the obtained data meet one of the predetermined patterns, e.g., if the obtained data is compared with a predetermined threshold value or a predetermined value, a normal sampling step is performed for measurement.

According to the VM method described in an embodiment of the inventions, the corresponding step is a maintenance, repair or overhaul step if the result meets one of the predetermined patterns. If the result does not meet any of the predetermined patterns, the result is disregarded. However, if the manufacturing equipment is crashed because the maintenance repair or overhaul step is not performed, the corresponding equipment parameters or data are stored and accumulated to a certain amount, and then a new pattern for comparison is dynamically added. The process apparatus is the production equipment having the mechanical structure and various parts. The mechanical structure requires maintenance because of the accumulation of bi-products during production, and aging consumable parts require periodic replacement. The patterns can be associated with the accumulation state of bi-products during production or the aging state of the consumable parts.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A virtual metrology system at least comprising:
a process apparatus comprising a set of process data, the process apparatus producing a workpiece according to the set of process data; and
a virtual metrology server configured to gather the set of process data, cluster the set of process data to obtain data clusters, and compare the data clusters with patterns, wherein
if the data clusters meet the patterns corresponding to the data clusters, performing a corresponding maintenance, repair, and overhaul step on the process apparatus.

2. The virtual metrology system as recited in claim 1, wherein one of the patterns is a maintenance pattern, and if the maintenance pattern is met, the corresponding maintenance, repair, and overhaul step is a maintenance step performed on the process apparatus.

3. The virtual metrology system as recited in claim 1, wherein one of the patterns is a parts-replacing pattern, and if the parts-replacing pattern is met, the corresponding maintenance, repair, and overhaul step is a parts-replacing step performed on the process apparatus.

4. The virtual metrology system as recited in claim 1, wherein each of the data clusters is defined by a set of coefficients comprising of mean coefficients, each mean coefficients of the set of coefficients is respectively multiplied by a corresponding value of the set of process data to obtain individual values and the individual values are summed together to calculate a conjectured value, and each of the patterns corresponds respectively to the set of coefficients and a predetermined value,
wherein the data clusters meet the patterns corresponding to the data clusters is determined by comparing the conjectured value of the data clusters with the predetermined value corresponding respectively to the patterns.

* * * * *